United States Patent [19]

Olla

[11] Patent Number: 5,057,903
[45] Date of Patent: Oct. 15, 1991

[54] THERMAL HEAT SINK ENCAPSULATED INTEGRATED CIRCUIT

[75] Inventor: Michael A. Olla, Austin, Tex.

[73] Assignee: Microelectronics and Computer Technology Corporation, Austin, Tex.

[21] Appl. No.: 611,391

[22] Filed: Nov. 8, 1990

Related U.S. Application Data

[63] Continuation of Ser. No. 380,968, Jul. 17, 1989, abandoned.

[51] Int. Cl.[5] .................... H01L 11/00; H01L 23/30
[52] U.S. Cl. ........................ 357/72; 357/74; 357/80; 357/81
[58] Field of Search .................... 357/74, 80, 81, 72

[56] References Cited

U.S. PATENT DOCUMENTS

| | | | |
|---|---|---|---|
| 2,638,523 | 5/1953 | Rubin | 357/72 |
| 2,758,263 | 8/1956 | Robillard | 357/72 |
| 2,809,332 | 10/1957 | Sherwood | 357/72 |
| 2,906,931 | 9/1959 | Armstrong | 357/72 |
| 3,223,903 | 12/1965 | Solomon | 357/72 |
| 3,896,544 | 7/1975 | Fosnough | 357/79 |
| 4,196,444 | 4/1980 | Butner et al. | 357/81 |
| 4,396,936 | 8/1983 | McIver et al. | 357/81 |
| 4,677,526 | 6/1987 | Muehling | 361/386 |
| 4,688,077 | 8/1987 | Wakabayashi et al. | 357/74 |
| 4,691,265 | 9/1987 | Calver et al. | 361/386 |
| 4,701,999 | 10/1987 | Palmer | 437/211 |
| 4,703,339 | 10/1987 | Matsuo | 357/81 |
| 4,750,031 | 6/1988 | Miller et al. | 357/81 |
| 4,788,626 | 11/1988 | Neidig et al. | 361/386 |
| 4,788,627 | 11/1988 | Ehlert et al. | 361/386 |
| 4,796,157 | 1/1989 | Ostrem | 361/386 |
| 4,812,949 | 3/1989 | Fontan et al. | 357/80 |
| 4,835,598 | 5/1989 | Higuchi et al. | 357/80 |

FOREIGN PATENT DOCUMENTS

| | | |
|---|---|---|
| 168042 | 9/1984 | Japan . |
| 2154791 | 9/1985 | Japan .................... 357/74 |
| 62-35546 | 2/1987 | Japan .................... 357/72 |
| 39039 | 2/1987 | Japan . |
| 291158 | 12/1987 | Japan . |
| 63-64346 | 3/1988 | Japan . |
| 65657 | 3/1988 | Japan . |
| 304650 | 12/1988 | Japan . |

Primary Examiner—Andrew J. James
Assistant Examiner—Viet Q. Nguyen
Attorney, Agent, or Firm—Fulbright & Jaworski

[57] ABSTRACT

An encapsulated integrated circuit which includes an integrated circuit die having a plurality of electric leads extending from the die. A thermal heat sink is positioned adjacent the die. The heat sink includes a thermoplastic material having a plurality of thermoconductive particles molded therein. A non-electrically conductive plastic material is sealably connected to the heat sink and encloses the die and seals around the leads. The heat sink plastic material is filled approximately 50 percent with metal particles, preferably in the form of powder. The particles may be from a group consisting of copper, aluminum, iron, carbon, aluminum nitride, silicon carbide, and boron nitride. The heat sink and the non-conductive plastic material have coacting interlocking interfaces.

3 Claims, 3 Drawing Sheets

THERMAL HEAT SINK ENCAPSULATED INTEGRATED CIRCUIT

This application is a continuation of application Ser. No. 380,968, filed July 17, 1989, now abandoned.

BACKGROUND OF THE INVENTION

It is conventional to encapsulate integrated circuit dies such as semiconductors in a suitable plastic package to protect the integrated circuit mechanically, electrically, and chemically. However, such encapsulation also encloses the heat generating attributes of the integrated circuit and undesirably reduces its heat dissipation. In order to overcome this problem, solid metal inserts have been included in some epoxy encapsulants in an attempt to provide a heat sink for transferring the generated heat out of the encapsulated integrated circuit package. However, such solutions have been expensive and such encapsulated packages were subject to failure since it is difficult to provide a good seal between a plastic encapsulant and a solid metal heat sink.

The present invention is directed to a plastic encapsulated integrated circuit having a heat sink which includes a thermoplastic material having a plurality of thermoconductive particles molded therein to provide a high-performance, high-sinking package which is securely sealed.

SUMMARY

The present invention is directed to an encapsulated integrated circuit which includes an integrated circuit die having a plurality of electrical leads extending from the die. A thermal heat sink is positioned adjacent the die but out of contact with the leads. The heat sink includes a thermoplastic material having a plurality of thermoconductive particles molded therein. A non-electrically conductive plastic material is sealably connected to the heat sink and encloses the remainder of the die and seals around the leads.

Still a further object of the present invention is wherein the heat sink is filled approximately 40 to 60 percent with metal particles. Preferably, the plastic heat sink is filled approximately 50 percent with metal particles.

Still a further object is wherein the thermoconductive particles are from a group consisting of copper, aluminum, iron, aluminum nitride, silicon carbide, boron nitride, and carbon.

Yet a still further object is wherein the heat sink and the non-electrically conductive plastic material have coacting interlocking interfaces for forming a more secure seal for encapsulating the integrated circuit.

Further objects, features and advantages will be apparent from the following description of presently preferred embodiments of the invention, given for the purpose of disclosure and taken in conjunction with the accompaning drawings.

DESCRIPTION OF THE PREFERRED EMBODIMENTS

Figure 1:
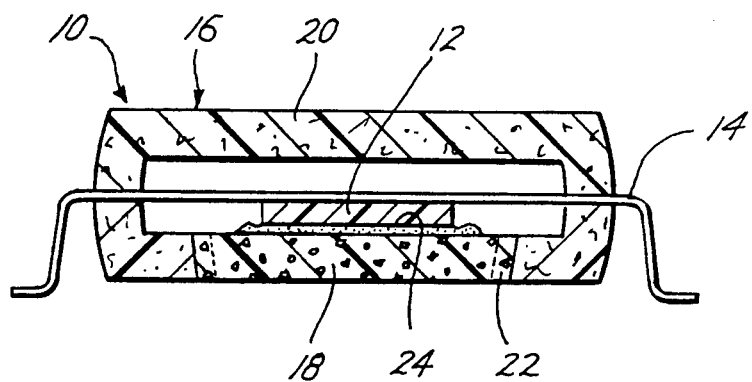
FIG. 1 is a cross-sectional elevational view of an encapsulated integrated circuit having a metal particle filled heat sink.
Figure 2:
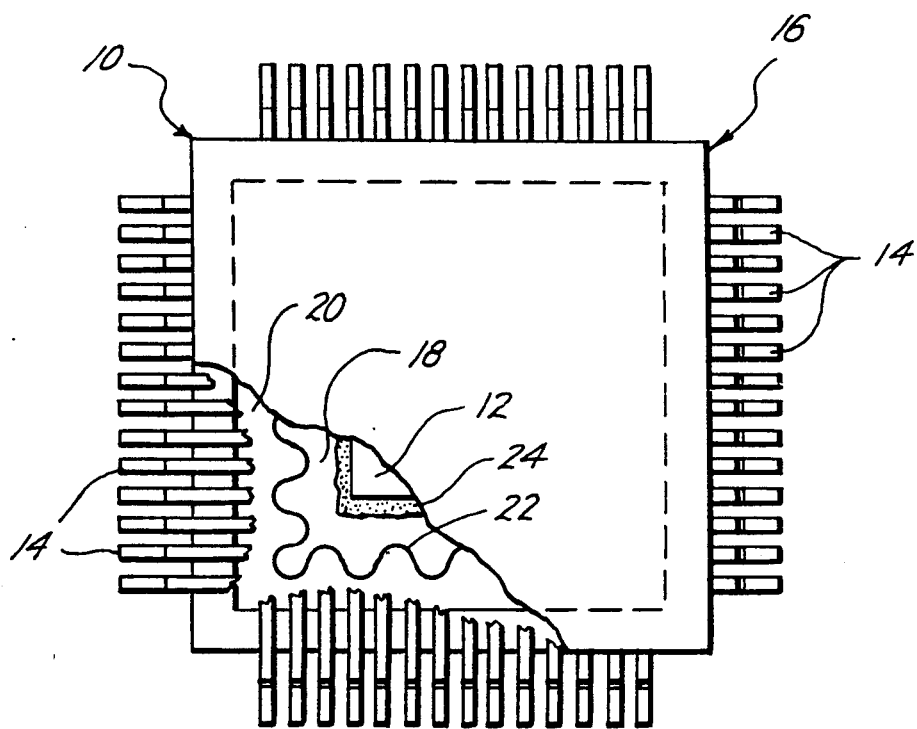
FIG. 2 is a top view, partly in cross-section, of the article of FIG. 1.

Referring now to the drawings, particularly to FIGS. 1 and 2, the reference numeral 10 generally indicates the encapsulated integrated circuit of the present invention which generally includes one or more integrated circuit die 12, shown as one, having a plurality of electrical leads 14, which may be a conventional lead frame or TAB tape, and a plastic enclosure 16. The enclosure 16 encloses and protects the integrated circuit die 12 while allowing electrical connections to be made to the die 12 through the leads 14.

a first portion of the enclosure 16 is a thermal heat sink 18 positioned adjacent the die 12 for conducting heat therefrom, but is out of contact with the electrical leads 14 so as not to create any electrical shorts. The heat sink 18 includes a thermoplastic material having a plurality of thermoconductive particles molded therein. The thermoplastic material may be any suitable material, such as polyphenylene sulfide, polyetherimide, polyethersultone, liquid crystal polymers, or polyetheretherketone. The thermoplastic may be filled with any suitable thermoconductive particles, such as metal particles of aluminum, copper, carbon, iron, aluminum nitride, boron nitride, or silicon carbide. These particles may range in volume of approximately 40 to 60 percent of the heat sink. The greater the volume of metal particles then the greater will be the heat dissipation from the die 12. Preferably, the volume of metal particles is approximately 50 percent. As the percentage increases beyond 60 percent, the metal filled heat sink 18 has a tendency to crumble and mechanically fail. Preferably, the metal particles are in the form of flakes or powder and powder is the preferred embodiment. Preferably, the sizes of the particles are in the range of 80 through 100 microns.

Of course, the metal filled heat sink 18 is kept out of contact with the electrical leads 14 so as not to cause electrical shorts. The remainder 20 of the enclosure 16 is of any suitable thermoplastic such as that previously described. In the preferred embodiment, the non-conductive plastic portion 20 is polyphenylene sulfide and the plastic in the heat sink 18 is a liquid crystal polymer.

Referring now to FIG. 2, the connection between the metal filled plastic heat sink 18 and the plastic portion 20 of the enclosure is preferably a coacting interlocking interface 22, which more securely locks the heat sink 18 and the enclosure 20 together. While the interface 20 is illustrated as a knit line, it may be any suitable type of interlocking interface. Preferably, a thermoconductive adhesive 24 (such as Abelstick Abelbond) is provided between the die 12 and the heat sink 18 for providing a good thermocontact for dissipating more heat from the die 12.

The plastic in the heat sink 18 and the portion 20 may be the same or different plastics, and may be formed in various conventional ways. Preferably, the heat sink 18 is molded first and the non-conductive portion 20 is molded secondly. The entire enclosure 16 may be conventionally molded in a conventional coinjection molding machine, such as model Imperial H4-75 ARS sold by Newbury, Inc.

Various other embodiments may be provided as will be more fully described hereinafter wherein like parts to those used in FIGS. 1 and 2 will be similarly numbered with the addition of the suffixes "a" and "b".

Figure 3:
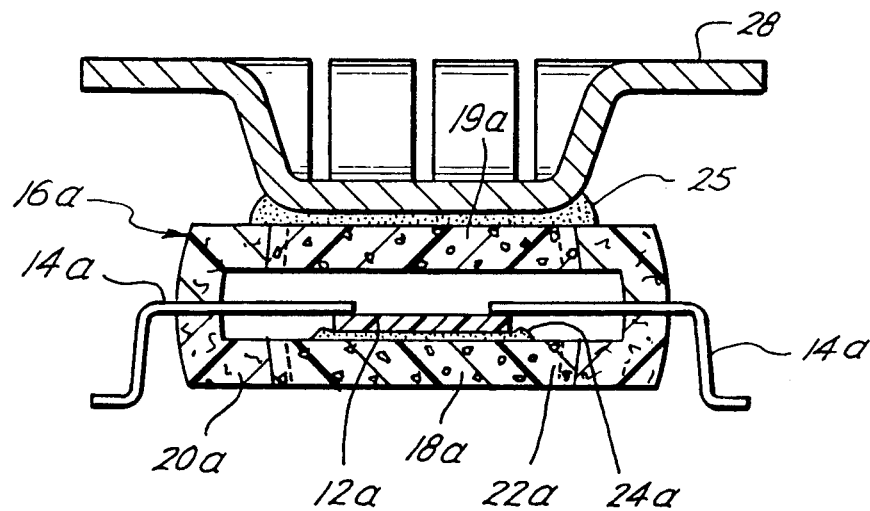
FIG. 3 is a cross-sectional elevational view of another embodiment of the present invention having a metal heat sink connected to a metal particle filled heat sink.
Figure 4:
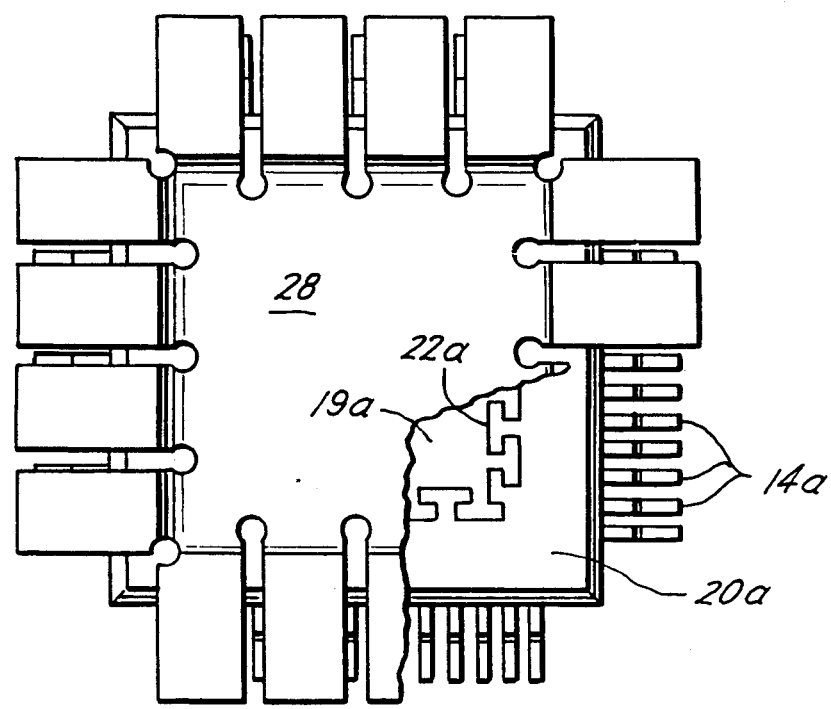
FIG. 4 is a top view, partly in cross-section, of the article of FIG. 3.

Referring now to FIGS. 3 and 4, an encapsulated integrated circuit die 12a is shown encapsulated in an enclosure 16a having a first heat sink 18a in the bottom of the enclosure 16a and against the die 12a and a second metal filled heat sink 19a in the top of the enclosure 16a. Again, the enclosure 16a includes a non-electrically conductive portion 20a bonded to the heat sinks 18a and 19a and enclosing the die 12a and sealing against the leads 14a. In this embodiment, the enclosure 16a has metal filled heat sinks in both the top and bottom of the enclosure. In addition, an all-metal heat sink 28 may be connected to one or both of the metal filled molded heat sinks 18a and 19a, here shown as being in contact with heat sink 19a by a thermally conductive adhesive 25, such as Abelstick Abelbond. Again, a suitable coacting interlocking interface 22a is provided between each of the molded heat sinks 18a and 19a with the non-conductive mold portion 20a.

Figure 5:
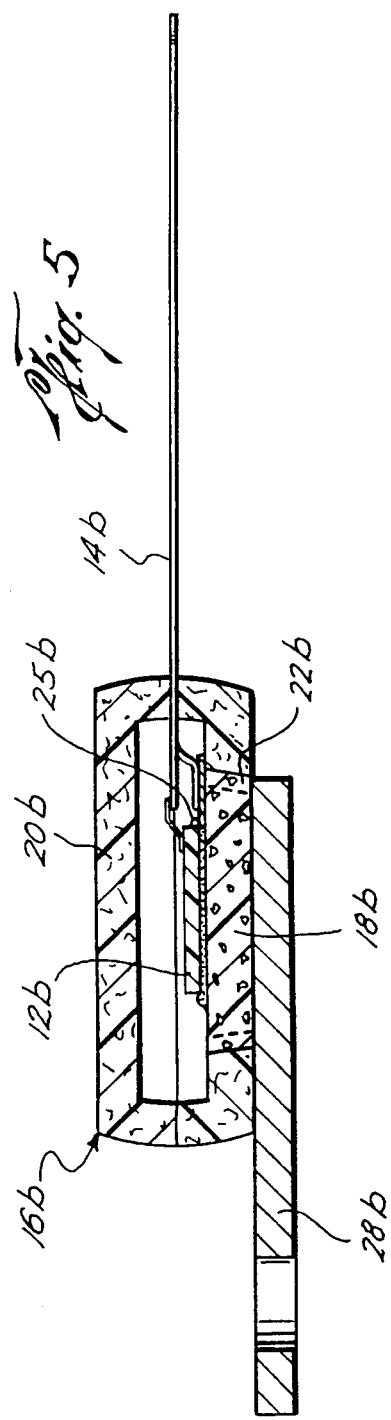
FIG. 5 is a cross-sectional elevational view of another form of the present invention.
Figure 6:
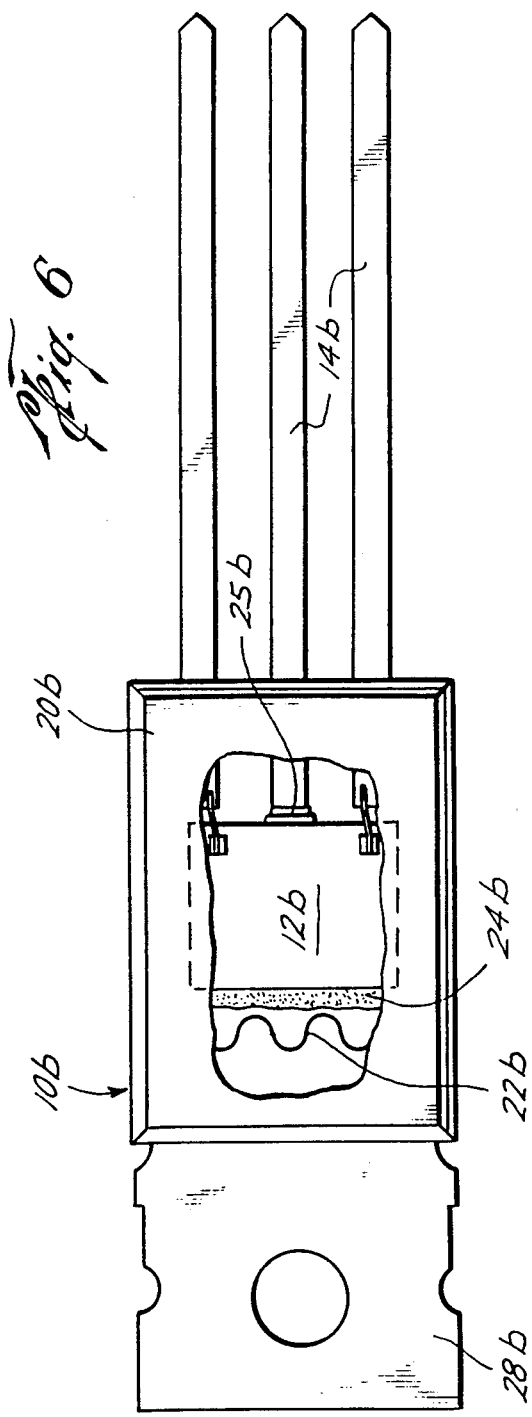
FIG. 6 is a top view, partly in cross-section, of the article of FIG. 5.

Referring now to FIGS. 5 and 6, an integrated circuit encapsulated package can be as shown in which the die 12b is in the form of a power transistor having electrical leads 14b. A molded metal filled heat sink 18b is positioned adjacent the die 12b in the encapsulated enclosure 16b and is connected to a suitable bracket mounting metal heat sink 28b. If desired, the heat sink mounting bracket 28b and encapsulated package 10b could be turned upside down so that the heat from the power transistor 12b rises directly to the heat sink 28b.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. An encapsulated integrated circuit comprising,
   an integrated circuit die having a plurality of electrical leads extending from the die,
   a thermal heat sink positioned adjacent the die, but out of contact from the leads, said heat sink including a thermoplastic material having a plurality of thermoconductive particles molded therein wherein the heat sink is filled approximately 40 to 60 percent with metal particles,
   a non-electrically conductive thermoplastic material sealably bonded to the heat sink, said plastic material forming a housing enclosing the die and said leads sealably extending through the thermoplastic material, and
   wherein the heat sink and the second thermoplastic material have coacting interlocking mating interfaces for mechanically locking the heat sink to the thermoplastic material.

2. The encapsulated integrated circuit of claim 1 wherein the thermoconductive particles are from a group of consisting of copper, aluminum, iron, carbon, aluminum nitride, silicon carbide, and boron nitride.

3. The encapsulated integrated circuit of claim 1 wherein the metal particles are in the form of metal powder.

* * * * *

UNITED STATES PATENT OFFICE
CERTIFICATE OF CORRECTION

Page 1 of 2

Patent No. 5,057,903         Dated Oct. 15, 1991

Inventor(s) Michael A. Olla

It is certified that error appears in the above-identified patent and that said Letters Patent is hereby corrected as shown below:

Column 2, line 20, delete the first occurrence of "a" and replace it with -- A --

Column 4, delete Claim 1, and replace it with --

1.  An encapsulated integrated circuit comprising,
    an integrated circuit die having a plurality of electrical leads extending from the die,
    a thermal heat sink positioned adjacent the die, but out of contact from the leads, said heat sink including a thermoplastic material having a plurality of thermoconductive particles molded therein wherein the heat sink is filled approximately 40 to 60 percent with metal particles,
    a electrically non-conductive thermoplastic material sealably bonded to the heat sink, forming a housing enclosing the die and said leads sealably extending through said non-conductive thermoplastic material,
    wherein the thermoplastic material is selected from the group consisting of polyphenylene sulfide, polyetherimide, polyethersulton, liquid crystal polymers, and polyetheretherketone, and

UNITED STATES PATENT AND TRADEMARK OFFICE
CERTIFICATE OF CORRECTION

PATENT NO. : 5,057,903

DATED : Oct. 15, 1991

INVENTOR(S) : Michael A. Olla

It is certified that error appears in the above-indentified patent and that said Letters Patent is hereby corrected as shown below:

```
     wherein the heat sink and the second non-conductive
thermoplastic material have coacting interlocking mating
interfaces for mechanically locking the heat sink to the
second thermoplastic material.--.
```

Signed and Sealed this

Second Day of November, 1993

Attest:

BRUCE LEHMAN

Attesting Officer     Commissioner of Patents and Trademarks